(12) United States Patent
Suzuki

(10) Patent No.: US 6,492,648 B2
(45) Date of Patent: Dec. 10, 2002

(54) LAMP ANNEALING APPARATUS AND METHOD OF MANUFACTURING SEMICONDUCTOR DEVICE

(75) Inventor: Hideki Suzuki, Tokyo (JP)

(73) Assignee: NEC Corporation, Tokyo (JP)

(*) Notice: Subject to any disclaimer, the term of this patent is extended or adjusted under 35 U.S.C. 154(b) by 17 days.

(21) Appl. No.: 09/784,126

(22) Filed: Feb. 16, 2001

(65) Prior Publication Data
US 2001/0018276 A1 Aug. 30, 2001

(30) Foreign Application Priority Data
Feb. 24, 2000 (JP) .................. 2000-047429

(51) Int. Cl.$^7$ .................. H05B 6/00; H01L 21/477
(52) U.S. Cl. .................. 250/492.2; 438/799
(58) Field of Search .......... 250/492.1, 492.2, 250/522.1; 438/795, 799, 800; 219/200, 201, 219, 220

(56) References Cited
FOREIGN PATENT DOCUMENTS

| JP | 2-280319 | 11/1990 | | |
|---|---|---|---|---|
| JP | 9-74079 | * 3/1997 | ......... | H01L/21/304 |

* cited by examiner

Primary Examiner—Michael Sherry
Assistant Examiner—Evan Pert
(74) Attorney, Agent, or Firm—Sughrue Mion, PLLC

(57) ABSTRACT

To provide a lamp annealing apparatus, which prevents clouding of a reflector, achieves stability of temperature for heat-treatment and prevents oxidization of a front surface of a semiconductor wafer. The lamp annealing apparatus includes a lamp unit 1 for heating at an upper portion of a chamber 10 and a reflector 7a for stabilizing temperature at a lower portion of the chamber 10. Process gas is supplied to a side of a front surface 21 of a semiconductor wafer 2 located and rotated on a rotating cylinder 4 in the chamber 10, and rear face gas for preventing clouding of the reflector 7a is supplied to a side of a rear surface 22 of the semiconductor wafer 2. There are further included mass flow controllers 15a to 15d for mixing gases to obtain a desire rear face gas. The rear face gas is flowed around the periphery of the reflector 7a to be exhausted.

17 Claims, 2 Drawing Sheets

LAMP ANNEALING APPARATUS AND METHOD OF MANUFACTURING SEMICONDUCTOR DEVICE

BACKGROUND OF THE INVENTION

1. Field of the Invention

The present invention relates to a lamp annealing apparatus used for oxidization, nitriding, heat treatment, or the like of a semiconductor wafer and method of manufacturing a semiconductor device.

2. Description of the Related Art

In recent years, a lamp annealing apparatus which can achieve quick heating and cooling has been used in forming an oxide film or a nitride film on a semiconductor wafer. The conventional lamp annealing apparatus is such that the semiconductor wafer installed in a quartz or metal chamber is heated by emitting light of a xenon lamp or the like, a plurality of process gas sources being connected to the chamber as required depending upon treatment steps.

The construction of such a conventional lamp annealing apparatus will be described with reference to FIG. 1, which is a schematic view thereof. The conventional apparatus, as shown in FIG. 1, has a quartz or metal chamber 10 in which a lamp unit 1 including a xenon lamp or the like as a lamp source, a quartz board 11 to partition the lamp unit 1, a support ring 3 for horizontally supporting one semiconductor wafer 2 and a rotating cylinder 4 for carrying the support ring 3 are equipped.

This rotating cylinder 4, which can rotate the semiconductor wafer 2 in the chamber 10, is rotated by a driving mechanism (not shown). The chamber 10 is provided at its inner bottom with a reflector (an aluminum reflecting mirror) 7 for ensuring stability of temperature and further provided with a gas supply line 5 for supplying process gas into the chamber 10 and a gas exhaust line 6 for exhausting treated gas.

In order to prevent clouding of the reflector 7 generated during the heat-treatment, there is provided a rear face gas supply line 8 for belching out rear face gas from the lower portion of the chamber 10 to the rear surface 22 of the semiconductor wafer 2. The rear face gas supply line 8 branches into a plurality of lines which are connected to a plurality of rear face gas supply ports 12, respectively, opening into the reflector 7 in such a manner that the rear face gas belches out through the rear face gas supply ports 12 into the chamber 10.

A plurality of rear face gas exhaust ports 13 for exhausting the rear face gas are opened at a periphery of the surface of the reflector 7 and the rear face gas exhaust ports 13 are connected to rear face gas exhaust lines 9 so as to exhaust the rear face gas from the chamber 10. In order to achieve even distribution of temperature throughout the semiconductor wafer 2, a sensor (not shown) for controlling the temperature is embedded in the rear face gas supply line slightly below the reflector 7.

In case of heating the semiconductor wafer 2 by using the conventional lamp annealing apparatus having such a construction, first, the semiconductor wafer 2 is transferred from an entrance (not shown) into the chamber 10 to be located on the support ring 3. Then, the desired process gas from the gas supply line 5 as well as the rear face gas from the rear face gas supply line 8 are supplied, and the lamp unit 1 illuminates the rotating semiconductor wafer 2 to be heated up to higher temperature.

In this conventional lamp annealing apparatus, the upper surface of the reflector 7 provided for ensuring stability of temperature is occasionally clouded by out-diffusion from the semiconductor wafer 2 during the heat-treatment. Then, in order to prevent generation of such clouding, the nitrogen gas as the rear face gas is belched out from the rear face gas supply port 12 toward the side of the rear surface 22 of the semiconductor wafer 2 so as to blow off the out-diffusion.

The silicon wafer as the semiconductor wafer 2, however, is formed with a thin natural oxide film before the heat-treatment and the natural oxide film reacts with the nitrogen gas as the rear face gas to generate fine particles of silicon oxide. The fine particles of silicon oxide cloud the reflector.

The new problem can be solved effectively by applying a small amount of oxygen gas into the nitrogen gas as the rear face gas. In this case, the amount of oxygen gas must be controlled because the rear face gas occasionally may turn to the side of the front surface 21 of the wafer 2 through a gap around the support ring 3, which results in causing a problem of oxidizing unfavorably an element forming surface of the front surface 21 of the wafer 2 to vary transistor characteristics depending upon amounts of the oxygen gas applied. Therefore, the control of the mix ratio of oxygen gas to nitrogen gas in the rear face gas is important.

In this way, in the conventional lamp annealing apparatus, as disclosed in Japanese Patent Laid-Open No. 2-280319, the rate control has been carried out on the process gas, but not carried out on the rear face gas.

SUMMARY OF THE INVENTION

Accordingly, one object of the present invention is to provide an effective lamp annealing apparatus which prevents clouding of the reflector to achieve stability of temperature for the heat-treatment, and prevents the oxidization of the element forming surface of the front surface of the semiconductor wafer.

Another object of the present invention is to provide an effective method of a semiconductor device by using the lamp annealing apparatus mentioned above.

According to one feature of the present invention, there is provided a lamp annealing apparatus, which comprises a chamber, a support member for supporting a semiconductor wafer having a front surface on which semiconductor elements are to be formed and a rear surface, a lamp unit provided at the side of the front surface in the chamber, a reflector for stabilizing temperature provided at the side of the rear surface in the chamber, a first means for supplying a process gas at the side of the front surface in the chamber to treat a process on the front surface of the semiconductor wafer, and a second means for supplying a rear face gas at the side of the rear surface in the chamber to prevent clouding of the surface of the reflector. The rear face gas is a mixture gas which includes a first gas as a main gas and a second gas as a subordinate gas adding to the first gas, and the second means includes a device which mix the first gas and the second gas to become a desired mixture ratio.

According to another feature of the present invention, there is provided a lamp annealing apparatus, which comprises a lamp unit for heating at an upper portion of a chamber, and a reflector for stabilizing temperature at an lower portion of the chamber. In the chamber, process gas is supplied to a side of a front surface having an element forming surface of a semiconductor wafer located on a rotating cylinder in the chamber to be rotated, and rear face gas for preventing cloud of the reflector is supplied to a side of a rear surface of the semiconductor wafer. The process gas and the rear face gas have different compositions to each other.

According to another aspect of the present invention, there is provided a method of manufacturing a semiconductor device which comprises steps of: setting a semiconductor wafer on a supporting member in a chamber, the semiconductor wafer having a front surface on which semiconductor elements are to be formed and a rear surface, the chamber having a lamp unit for heating at an upper portion of a chamber and a reflector for stabilizing temperature at an lower portion of the chamber; supplying process gas to a side of the front surface of the semiconductor wafer and rear face gas for preventing cloud of the surface of the reflector to a side of the rear surface of the semiconductor wafer, the rear gas being nitrogen gas containing a minor mount of oxygen gas; and heating said semiconductor wafer by the lamp unit.

In the apparatus or method mentioned above, the first gas as a main gas of the rear face gas is preferably nitrogen gas and the second gas as a subordinate gas of the rear gas is preferably oxygen gas containing at 20 ppm (parts per million) to 20000 ppm against the nitrogen gas.

Further, the rear face gas is preferably turned around the periphery of the reflector to be exhausted.

Moreover, a plurality of mass flow controllers is preferably arranged in parallel to control the mix ratio of the first and second gas in the rear face gas.

Further, a plurality of mass flow controllers are preferably adjusted to rates on the different order of ppm, and one of the mass flow controllers is for the nitrogen gas and the others are for oxygen gas.

Yet further, nitrogen gas adjusted by a mass flow controller for the nitrogen gas may be mixed with oxygen gas adjusted by one mass flow controller selected from mass flow controllers for the oxygen gas.

BRIEF DESCRIPTION OF THE DRAWINGS

This above mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Next, a lamp annealing apparatus according to an embodiment of the present invention will be described with reference to FIG. 2, which is a schematic view thereof.

Figure 2:
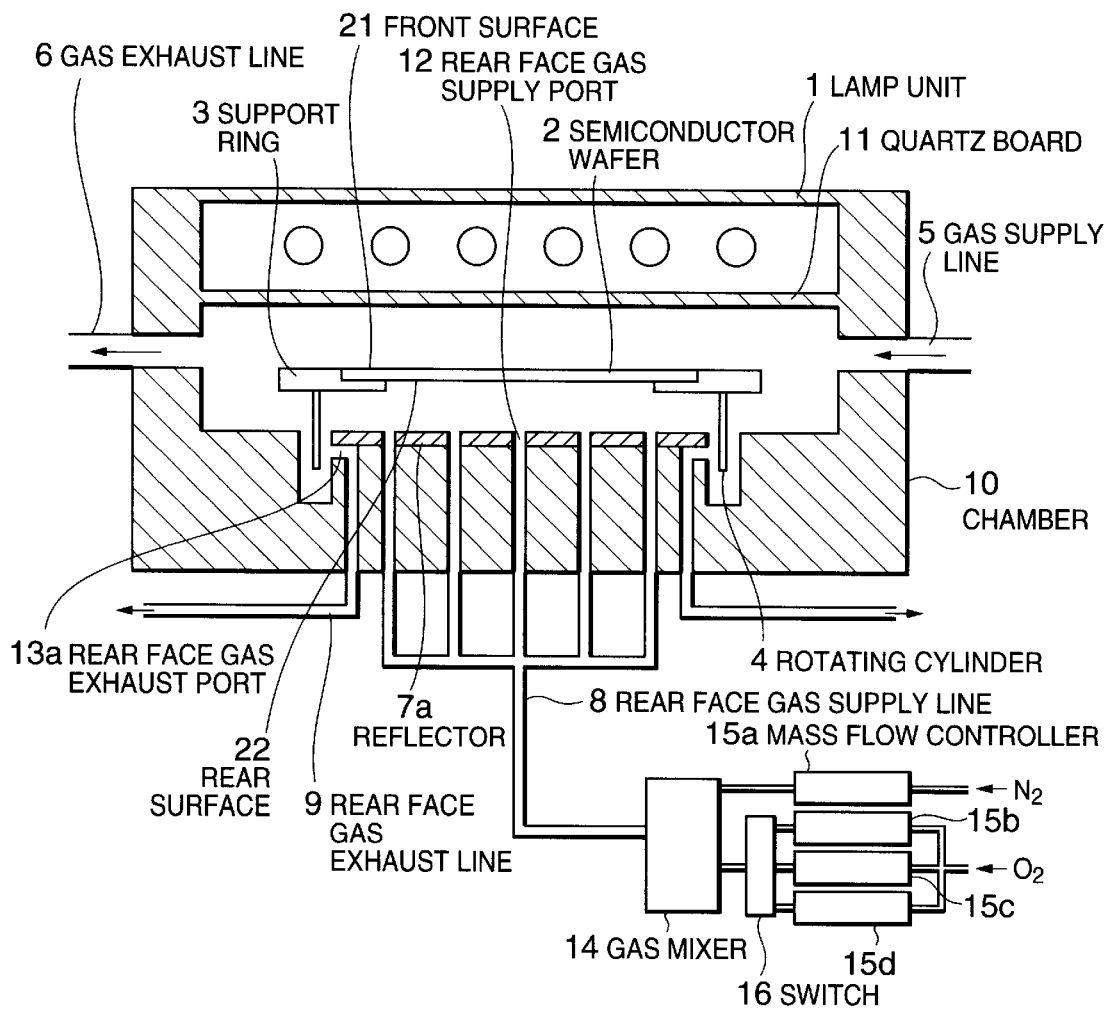
FIG. 2 is a schematic view of a lamp annealing apparatus according to an embodiment of the present invention.

The lamp annealing apparatus according to the present invention, as shown in FIG. 2, has a quartz or metal chamber 10 in which a lamp unit 1 including a xenon lamp or the like as a lamp source, a quartz board 11 to partition the lamp unit 1, a support ring 3 for horizontally supporting a silicon wafer 2 as a semiconductor wafer and a rotating cylinder 4 for carrying the support ring 3 as a support member are equipped.

The rotating cylinder 4 is rotated by a driving mechanism (not shown), which can rotate the semiconductor wafer 2 with the supporting ring 3 in the chamber 10. The chamber 10 is provided at its inner bottom with a reflector (an aluminum reflecting mirror) 7a for ensuring stability of temperature and further provided with a gas supply line 5 for supplying process gas into the chamber 10 and a gas exhaust line 6 for exhausting treated gas.

In order to prevent clouding of the upper surface of the reflector 7a generated by out-diffusion from the rear surface 22 of the semiconductor wafer 2 during the heat-treatment, there is provided a rear face gas supply line 8 for belching out rear face gas from the lower portion of the chamber 10 to the rear surface 22 of the semiconductor wafer 2. The rear face gas supply line 8 branches into a plurality of lines which are connected to a plurality of rear face gas supply ports 12, respectively, opening into the reflector 7a in such a manner that the rear face gas belches out through the rear face gas supply ports 12 into the chamber 10.

A plurality of rear face gas exhaust ports 13a for exhausting the rear face gas are opened at the bottom of the chamber 10 where the reflector 7a is located, along a periphery of the reflector 7a and the rear face gas exhaust ports 13a are connected to rear face gas exhaust lines 9, respectively, so as to exhaust the rear face gas from the chamber 10.

That is, the rear face gas supplied into the chamber 10 is turned around (flows around) the periphery of the reflector 7a into the rear face gas exhaust port 13a through a gap between the reflector 7a and the rotating cylinder 4, and is exhausted outwardly through the rear face gas exhaust line 9. Furthermore, in order to achieve even distribution of temperature throughout the semiconductor wafer 2, a sensor (not shown) for controlling the temperature is embedded in the rear face gas supply line slightly below the reflector 7a.

The rear face gas to be supplied into the rear face gas supply line 8 is adjusted by providing mass flow controllers 15a, 15b, 15c, 15d at each of nitrogen gas pipe and oxygen gas pipe in such a manner that the mixture ratio of both gases becomes as desired. The rear face gas adjusted by the mass flow controllers 15a to 15d is supplied through the gas mixer 14 into the rear face gas supply line 8. In the present embodiment, the oxygen gas pipe branches into three pipes so as to adjust the supply rate of the oxygen gas in multiple steps, and the pipes are provided with the mass flow controllers 15b, 15c, 15d which can be switched to be used.

The mass flow controller 15a can adjust nitrogen gas flow from 20000 cc/min. (minute) to 2000 cc/min. The mass flow controller 15b can adjust oxygen gas flow from 200 cc/min. to 20 cc/min. The mass flow controller 15c can adjust oxygen gas flow from 20 cc/min. to 2 cc/min. The mass flow controller 15d can adjust oxygen gas flow from 2.0 cc/min. to 0.2 cc/min.

When a rear face gas having oxygen gas of 2000 ppm–20000 ppm in volume against nitrogen gas is necessary, the switch 16 among mass flow controllers 15b–15d selects the mass flow controller 15b. Then, by adjusting nitrogen gas flow to 10000 cc/min. in mass flow controller 15a and oxygen gas flow to 20 cc/min. in mass flow controller 15b, a rear face gas having oxygen gas of 2000 ppm can be obtained. Also, by adjusting nitrogen gas flow to 10000 cc/min. in mass flow controller 15a and oxygen gas flow to 100 cc/min. in mass flow controller 15b, a rear face gas having oxygen gas of 10000 ppm can be obtained. Also, by adjusting nitrogen gas flow to 9000 cc/min. in mass flow controller 15a and oxygen gas flow to 180 cc/min. in mass flow controller 15b, a rear face gas having oxygen gas of 20000 ppm can be obtained.

When a rear face gas having oxygen gas of 200 ppm–2000 ppm in volume against nitrogen gas is necessary, the switch 16 among mass flow controllers 15b–15d selects the mass flow controller 15c. Then, by adjusting nitrogen gas flow to 10000 cc/min. in mass flow controller 15a and oxygen gas flow to 2 cc/min. in mass flow controller 15c, a rear face gas having oxygen gas of 200 ppm can be obtained. Also, by adjusting nitrogen gas flow to 10000 cc/min. in mass flow controller 15a and oxygen gas flow to 10 cc/min. in mass flow controller 15c, a rear face gas having oxygen gas of 1000 ppm can be obtained. Also, by adjusting nitrogen gas flow to 9000 cc/min. in mass flow controller 15a and oxygen gas flow to 18 cc/min. in mass flow controller 15c, a rear face gas having oxygen gas of 2000 ppm can be obtained.

When a rear face gas having oxygen gas of 20 ppm–200 ppm in volume against nitrogen gas is necessary, the switch 16 among mass flow controllers 15b–15d selects the mass flow controller 15d. Then, by adjusting nitrogen gas flow to 10000 cc/min. in mass flow controller 15a and oxygen gas flow to 0.2 cc/min. in mass flow controller 15d, a rear face gas having oxygen gas of 20 ppm can be obtained. Also, by adjusting nitrogen gas flow to 10000 cc/min. in mass flow controller 15a and oxygen gas flow to 1.0 cc/min. in mass flow controller 15d, a rear face gas having oxygen gas of 100 ppm can be obtained. Also, by adjusting nitrogen gas flow to 9000 cc/min. in mass flow controller 15a and oxygen gas flow to 1.8 cc/min. in mass flow controller 15d, a rear face gas having oxygen gas of 200 ppm can be obtained.

The operation of the present embodiment will be described below with reference to the FIG. 2. In case of heating the semiconductor wafer 2 by using the lamp annealing apparatus according to the present invention as shown in FIG. 2, first, one semiconductor wafer 2 is transferred from an entrance (not shown) into the chamber 10 to be located on the support ring 3 mounted on the rotating cylinder 4.

Then, desired process gas from the gas supply line 5 as well as the rear face gas from the rear face gas supply line 8 are supplied into the chamber 10.

The rotating cylinder 4, supporting ring 3 and the semiconductor wafer 2 are rotated by a driving mechanism (not shown), and the lamp unit 1 lights up to the rotating semiconductor wafer 2 to heat up to higher temperature.

As process gases, there are, for example, nitrogen gas, oxygen gas, ammonia gas, argon gas or water vapor. Each of the process gas is adjusted by a mass flow controller (not shown) and the kind of gas selected depending upon treatments such as oxidization, nitriding or heat-treatment, and then it is supplied from the gas supply line 5 into the chamber 10 to contact with the front surface 21 of the semiconductor wafer 2 for heat-treatment.

The inside of the chamber 10 can be kept at a constant temperature by the reflector 7a. In order to prevent clouding of the reflector 7a generated by the out-diffusion from the semiconductor wafer 2 during the heat-treatment, the rear face gas is supplied form the rear face gas supply line 8. The rear face gas supplied is exhausted from the rear face gas exhaust line 9.

At that time, the rear face gas to be exhausted flows into the rear face gas exhaust port 13a of the chamber 10 through the gap between the periphery of the reflector 7a and the rotating cylinder 4, and is exhausted from the rear face gas exhaust line 9 through the rear face gas exhaust port 13a, which permits enhancing separation of the process gas of the front surface face side from the rear face gas of the rear surface side.

Figure 1:
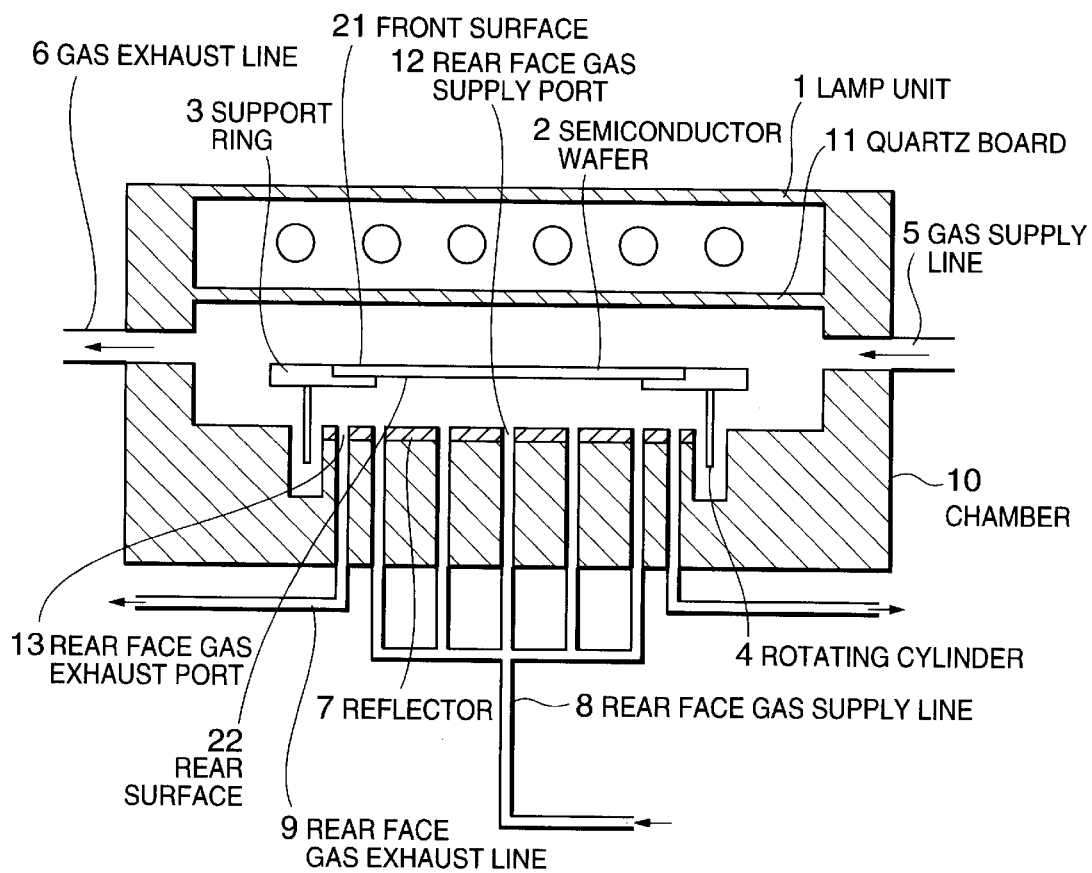
FIG. 1 is a schematic view of a conventional lamp annealing apparatus.

That is, in the conventional apparatus, the rear face gas exhaust port 13 (FIG. 1) is directly provided on the periphery of the reflector so that the cloud is often generated on the periphery of the reflector, while in the present invention, the rear face gas is turned around the periphery of the reflector into the rear face gas exhaust port 13a (FIG. 2) to be exhausted, which stabilizes the gas flow of the entire face of the reflector and prevents generation of reflector clouding.

Furthermore, the rear face gas to be supplied into the rear face gas supply line 8 is diluted and adjusted to be any desired mixture ratio by the plurality of mass flow controllers 15a to 15d and mixed in the gas mixer 14, which permits stable supply of the nitrogen gas containing oxygen of 20 ppm to 20000 ppm to the rear surface 22 of the semiconductor wafer 2.

For example, in the embodiment shown in FIG. 2 and explained before, the nitrogen gas as the rear face gas is supplied by adjustment by using the mass flow controller 15a. The oxygen gas is supplied by adjustment by using any one of the mass flow controllers 15b, 15c, 15d as required and mixed with the nitrogen gas in the gas mixer 14. In this case, the mass flow controllers 15b, 15c, 15d are adjusted to 200 cc to 20 cc, 20 cc to 2 cc, and 2.0 cc to 0.2 cc per minute, respectively.

This enables restraining the out-diffusion from the rear surface 22 of the semiconductor wafer 2 and the generation of the fine particles of silicon oxide by the reaction of the natural oxide film formed on the silicon surface with the nitrogen gas, which permits preventing the cloud of the reflector 7a and achieving stability of temperature.

As described above, the lamp annealing apparatus according to the present invention has the below-mentioned advantages. A first advantage is that the apparatus includes the devices for mixing to obtain a desired gas, which permits stable supply of the nitrogen gas containing oxygen of 20 ppm to 20000 ppm to the rear surface of the semiconductor wafer, restraining the generation of the fine particles of silicon oxide by the reaction of the natural oxide film formed on the silicon surface with the nitrogen gas, preventing clouding of the reflector and achieving stability of temperature.

A second effect is that the front surface and the rear surface of the semiconductor wafer can contact with gases having different composition, which permits supply of the nitrogen gas containing oxygen to the silicon surface of the rear surface and supply of the nitrogen gas to the element forming surface of the front surface, thereby having the above-described first effect and also preventing oxidization of the element forming surface on the front surface.

What is claimed is:

1. A lamp annealing apparatus, comprising:
   a chamber;
   a support member for supporting a semiconductor wafer, said semiconductor wafer having a front surface on which semiconductor elements are to be formed and a rear surface;
   a lamp unit provided in said chamber at the side of said semiconductor wafer having the front surface;
   a reflector for stabilizing temperature provided in said chamber at the side of said semiconductor wafer having the rear surface;
   a first means for supplying a process gas to said front surface in said chamber to perform a process on said front surface of said semiconductor wafer; and
   a second means for supplying a rear face gas to said rear surface in said chamber to prevent clouding of said reflector;
   said rear face gas being a mixture gas including a first gas as a main gas and a second gas as a subordinate gas added said first gas; and said second means including a device which mixes said first gas and said second gas to become a desired mixture ratio.

2. The lamp annealing apparatus according to claim 1, wherein said first gas of said rear face gas is nitrogen gas and said second gas of said rear face gas is oxygen gas.

3. The lamp annealing apparatus according to claim 2, wherein said rear face gas contains said oxygen at 20 ppm to 20000 ppm.

4. The lamp annealing apparatus according to claim 1, wherein said rear face gas flows around the periphery of said reflector to be exhausted.

5. The lamp annealing apparatus according to claim 1, wherein said second means includes a plurality of mass flow controllers which are arranged in parallel to control the mix ratio of said first and second gas in said rear face gas.

6. The lamp annealing apparatus according to claim 5, wherein said plurality of mass flow controllers are adjusted to rates of differing orders of ppm, and one of the mass flow controllers is for said first gas and the others are for said second gas.

7. The lamp annealing apparatus according to claim 5, wherein nitrogen gas as said first gas adjusted by said mass flow controller for the nitrogen gas is mixed with oxygen gas as said second gas adjusted by one of the mass flow controllers selected from said mass flow controllers for the oxygen gas.

8. A lamp annealing apparatus, comprising:
   a lamp unit for heating an upper portion of a chamber; and
   a reflector for stabilizing temperature at a lower portion of the chamber,
   in which process gas is supplied to a front element forming surface of a semiconductor wafer located on a rotatable cylinder in the chamber, and
   rear face gas for preventing clouding of said reflector is supplied to a rear surface of said semiconductor wafer, wherein said front surface and said rear surface of said semiconductor wafer each contact with gases having differing composition.

9. The lamp annealing apparatus according to claim 8, wherein and said rear face gas is nitrogen gas containing a small amount of oxygen gas.

10. The lamp annealing apparatus according to claim 9, wherein said rear face gas contains oxygen gas at 20 ppm to 20000 ppm.

11. The lamp annealing apparatus according to claim 8, wherein said rear face gas flows around the periphery of said reflector to be exhausted.

12. The lamp annealing apparatus according to claim 9, wherein a plurality of mass flow controllers are arranged in parallel to control the mix ratio of said nitrogen and oxygen gas in said rear face gas.

13. The lamp annealing apparatus according to claim 12, wherein said plurality of mass flow controllers are adjusted to rates of differing orders of ppm, and one of the mass flow controllers is for the nitrogen gas and the others are for oxygen gas.

14. The lamp annealing apparatus according to claim 12, wherein nitrogen gas adjusted by said mass flow controller for the nitrogen gas is mixed with oxygen gas adjusted by one of the mass flow controllers selected from said mass flow controllers for the oxygen gas.

15. A method of manufacturing a semiconductor device comprising steps of:
    setting a semiconductor wafer on a supporting member in a chamber, said semiconductor wafer having a front surface on which semiconductor elements are to be formed and a rear surface, said chamber having a lamp unit for heating at an upper portion of a chamber and a reflector for stabilizing temperature at an lower portion of the chamber;
    supplying process gas to said front surface of said semiconductor wafer and rear face gas, for preventing clouding of said reflector, to said rear surface of said semiconductor wafer, said rear face gas being nitrogen gas containing a minor amount of oxygen gas; and
    heating said semiconductor wafer by said lamp unit.

16. A method of manufacturing a semiconductor device according to claim 15,
    wherein said rear face gas contains oxygen gas at 20 ppm to 20000 ppm.

17. A method of manufacturing a semiconductor device according to claim 15,
    wherein a plurality of mass flow controllers are arranged in parallel to control the mix ratio of said nitrogen gas and said oxygen gas in said rear face gas.

* * * * *